(12) United States Patent
Park et al.

(10) Patent No.: US 7,840,866 B2
(45) Date of Patent: *Nov. 23, 2010

(54) DIGITAL BROADCASTING TRANSMISSION APPARATUS AND ROBUST STREAM CODING METHOD THEREOF

(75) Inventors: Eui-jun Park, Seoul (KR); Jung-pil Yu, Suwon-si (KR); Yong-sik Kwon, Seoul (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 1190 days.

This patent is subject to a terminal disclaimer.

(21) Appl. No.: 11/416,250

(22) Filed: May 3, 2006

(65) Prior Publication Data

US 2007/0198876 A1 Aug. 23, 2007

Related U.S. Application Data

(60) Provisional application No. 60/765,175, filed on Feb. 6, 2006.

(51) Int. Cl.
*H03M 13/00* (2006.01)
(52) U.S. Cl. .................. 714/752; 375/265; 375/341; 375/349; 375/240.01; 348/14.13; 348/385.1; 348/425.3; 348/432.1; 348/473; 714/755; 714/786; 714/784; 714/756
(58) Field of Classification Search ............. 375/219, 375/222, 240.01, 262, 264, 265, 270, 277, 375/285, 295, 296, 301, 316, 321, 340, 341, 375/346, 349; 348/14.13, 385.1, 393.1, 395.1, 348/397.1, 400.1, 403.1, 425.3, 432.1, 460, 348/473, 474; 370/912, 916; 714/755, 786, 714/752, 784, 756
See application file for complete search history.

(56) References Cited

U.S. PATENT DOCUMENTS

2002/0126222 A1 9/2002 Choi et al.

(Continued)

FOREIGN PATENT DOCUMENTS

WO    WO 2004/043073 A1    5/2004

(Continued)

OTHER PUBLICATIONS

U.S. Appl. No. 11/702,097, filed Feb. 2007, Eui-jun Park et al., Samsung Electronics Co., Ltd.

(Continued)

*Primary Examiner*—Guy J Lamarre
(74) *Attorney, Agent, or Firm*—Sughrue Mion, PLLC

(57) ABSTRACT

A digital broadcasting transmission apparatus and robust stream coding method thereof. The digital broadcasting transmission apparatus includes a robust processor that codes a robust stream of a dual transport stream where a normal stream and the robust stream are combined. The robust processor includes a demultiplexer (DE-MUX) that separates the normal stream and the robust stream from the dual transport stream; a robust encoder that appends a parity to the separated robust stream; a robust interleaver that interleaves the robust stream having the appended parity; and a MUX that combines the interleaved robust stream and the separated normal stream. Accordingly, a receiver of a simple structure can be provided.

12 Claims, 8 Drawing Sheets

U.S. PATENT DOCUMENTS

| | | |
|---|---|---|
| 2004/0028076 A1 | 2/2004 | Strolle et al. |
| 2005/0097428 A1 | 5/2005 | Chang et al. |
| 2007/0094567 A1* | 4/2007 | Park et al. .................. 714/753 |

FOREIGN PATENT DOCUMENTS

| | | |
|---|---|---|
| WO | WO 2005/115001 A1 | 12/2005 |
| WO | WO 2005/120062 A1 | 12/2005 |
| WO | WO 2006/006833 A1 | 1/2006 |

OTHER PUBLICATIONS

International Search Report mailed on May 8, 2007, in International Application No. PCT/KR2007/000634.

Written Opinion of the International Searching Authority mailed on May 8, 2007, in International Application No. PCT/KR2007/000634.

U.S. Appl. No. 11/416,256, filed May 3, 2006, Eui-jun Park et al., Samsung Electronics Co., Ltd.

Supplementary European Search Report issued Sep. 17, 2009 in corresponding European Application No. 07708784.9.

* cited by examiner

FIG. 4A (a) | SYNC | PID | Robust data |
| | 1 | 3 | 184 |

(b) | SYNC | PID | AF Header | Null data | Normal data |
| | 1 | 3 | 2 | N | 182-N |

(c) | SYNC | PID | AF Header | Robust data | Normal data |
| | 1 | 3 | 2 | N | 182-N |

FIG. 4B

| SYNC | PID | Robust data |
| SYNC | PID | Normal data |
| SYNC | PID | Normal data |
| SYNC | PID | Normal data |

· · ·

FIG. 5A (a)
| SYNC | PID | Robust data |
|---|---|---|
| 1 | 3 | 184 |

(b)
| SYNC | PID | AF Header | Stuff byte | Null data | Normal data |
|---|---|---|---|---|---|
| 1 | 3 | 2 | S | N | 182-N-S |

(c)
| SYNC | PID | AF Header | Stuff byte | Robust data | Normal data |
|---|---|---|---|---|---|
| 1 | 3 | 2 | S | N | 182-N-S |

FIG. 5B

| | | | |
|---|---|---|---|
| SYNC | PID | AF Header | Stuff byte | Robust data (182-S) |
| SYNC | PID | AF Header | Stuff byte | Normal data |
| SYNC | PID | AF Header | Stuff byte | Normal data |
| SYNC | PID | AF Header | Stuff byte | Normal data |
| 1 | 3 | 2 | S | |

...

US 7,840,866 B2

DIGITAL BROADCASTING TRANSMISSION APPARATUS AND ROBUST STREAM CODING METHOD THEREOF

CROSS-REFERENCE TO RELATED APPLICATIONS

This application claims the benefit of U.S. Provisional Application No. 60/765,175 filed Feb. 6, 2006, in the United States Patents and Trademark Office, the disclosure of which is incorporated herein by reference.

BACKGROUND OF THE INVENTION

1. Field of the Invention

Aspects of the present invention generally relate to a digital broadcasting transmission apparatuses and a robust stream coding method thereof. More particularly, aspects of the present invention relate to a digital broadcasting transmission apparatus and a robust stream coding method thereof that can be used with a receiving apparatus of a simple structure.

2. Description of the Related Art

The Advanced Television Systems Committee (ATSC) vestigial sideband (VSB) scheme, which is a terrestrial digital broadcasting system in U.S.A., is disadvantageous in that its reception performance is not good in a poor channel environment, particularly, in a Doppler fading channel environment. Thus, the ATSC has accepted new suggestions under preconditions that compatibility with existing receivers is provided, that the existing receivers do not suffer performance depreciation, and that the performance is improved in comparison with the existing receivers in order to enhance the VSB reception performance.

Among the suggestions for VSB system improvement, a dual transport stream scheme enables watching of the existing HD video in a good channel environment and allows for video reception even in a poor channel environment. The dual transport stream scheme generates and transmits a dual transport stream with robust data added to normal data of the conventional ATSC VSB so as to successfully operate in a hostile channel environment.

Hereafter, in reference to FIGS. 1 and 2, a conventional dual transport stream transmission and reception system is described that provides good performance by transmitting and receiving a normal stream and a robust stream and exchanging information by the robust stream.

FIG. 1 is a block diagram of a conventional VSB transmission apparatus, and FIG. 2 is a block diagram of a robust processor of FIG. 1.

Referring first to FIG. 1, the conventional VSB transmission apparatus includes a randomizer 10, a first RS (Reed Solomon) encoder 11, a first interleaver 12, a robust processor 13, a deinterleaver 14, a second RS encoder 15, a second interleaver 16, a trellis encoder 17, and a multiplexer (MUX) 18.

Although it is not shown in the drawing, a dual transport stream (TS), which is the combination of the normal stream and the robust stream, is constructed at the front end of the randomizer 10. The dual transport stream passes through the randomizer 10, the first RS encoder 11, the first interleaver 12, the robust processor 13, the deinterleaver 14, the second RS encoder 15, the second interleaver 16, the trellis encoder 17, and the MUX 18, and then is outputted.

Since the robust processor 13, which is responsible for coding the robust stream, follows the first RS encoder 11, the parity added to the dual transport stream at the front end of the randomizer 10 is not correct. Therefore, the deinterleaver 14 is provided after the robust processor 13, and the second RS encoder 15 is provided to modify the incorrect parity. At this time, the first RS encoder 11 only generates a parity space for interleaving without adding the real parity.

Referring now to FIG. 2, the robust processor 13 includes a symbol interleaver 13a, a normal/robust (N/R) demultiplexer (DE-MUX) 13b, a robust encoder 13c, a robust interleaver 13d, an N/R MUX 13e, and a symbol deinterleaver 1.3f.

The dual transport stream interleaved by the first interleaver 12 is converted by the symbol at the symbol interleaver 13a, and is separated to a normal stream and a robust stream at the N/R DE-MUX 13b. The normal stream is inputted directly to the N/R MUX 13e. The robust stream is processed at the robust encoder 13c and the robust interleaver 13d, and then fed to the N/R MUX 13e. The N/R MUX 13e multiplexes the normal stream and the robust stream, and the multiplexed stream is converted by the bit at the symbol deinterleaver 13f for outputting.

The conventional VSB receiving apparatus includes a demodulator for processing the dual transport stream received from the VSB transmission apparatus of FIG. 1, an equalizer, a viterbi decoder, a robust decoder, a MUX, a first deinterleaver, an RS decoder, a first derandomizer, a second deinterleaver, a parity eraser, a second derandomizer, and a robust packet DE-MUX. The robust decoder includes a TCM MAP decoder (TCM refers to trellis code modulation; MAP refers to maximum a posteriori probability.), a robust deinterleaver, a robust MAP decoder, a robust interleaver, a frame formatter, and a symbol deinterleaver.1 Information exchange is conducted through a loop formed between the TCM MAP decoder and the robust MAP decoder until sufficient performance is acquired. Upon the completion of the information exchange, the data output from the TCM MAP decoder is used for receiving the normal stream, and the frame formatter forwards the data output from the robust MAP decoder to a position corresponding to the robust stream of the normal stream and the robust stream. In doing so, the empty position corresponding to the normal stream is outputted via the symbol deinterleaver 3f to be used for the robust stream reception.

As discussed above, when the conventional VSB transmission and reception apparatuses add the robust coding, such as a ¼ rate coding, to the robust stream using the robust encoder 13c, the VSB receiving apparatus should be constructed in accordance with the structure of the VSB transmission apparatus. As shown, the VSB receiving apparatus has a complicated structure.

SUMMARY OF THE INVENTION

Aspects of the present invention have been provided to address the above-mentioned and other problems and disadvantages occurring in the conventional arrangement, and an aspect of the present invention is to provide a receiver of a simple structure for the performance improvement of a robust stream included in a dual transport stream even when additive coding is implemented at various rates.

Additional aspects and/or advantages of the invention will be set forth in part in the description which follows and, in part, will be obvious from the description, or may be learned by practice of the invention.

In accordance with the above aspect of the present invention, a digital broadcasting transmission apparatus includes a robust processor that codes a robust stream of a dual transport stream in which a normal stream and the robust stream are combined. The robust processor includes a demultiplexer (DE-MUX) that separates the normal stream and the robust stream from the dual transport stream; a robust encoder that appends a parity to the separated robust stream; a robust interleaver that interleaves the robust stream having the appended parity; and a MUX that combines the interleaved robust stream and the separated normal stream.

The DE-MUX may convert and output the separated robust stream by the symbol. The robust processor may further include a symbol deinterleaver that deinterleaves the robust stream that is interleaved by the symbol. The symbol deinterleaver may include a (normal/robust) N/R MUX that combines the normal stream and the robust stream; a byte/symbol converter that converts the combined normal stream and robust stream by the byte; and an N/R DE-MUX that separates the normal stream and the robust stream that have been converted by the byte.

The robust encoder may be an encoder of a Recursive Systematic Code (RSC) type.

In accordance with an aspect of the present invention, a robust stream coding method of a dual transport stream wherein a normal stream and a robust stream are combined at a digital broadcasting transmission apparatus, includes separating the normal stream and the robust stream from the dual transport stream; appending a parity to the separated robust stream; interleaving the robust stream having the appended parity; and combining the interleaved robust stream and the separated normal stream.

The separating of the normal stream and the robust stream may convert and output the separated robust stream by the symbol. The robust stream coding method may further include deinterleaving the robust stream that is interleaved by the symbol. The deinterleaving of the robust stream may include combining the normal stream and the robust stream; converting the combined normal stream and robust stream by the byte; and separating the normal stream and the robust stream that are converted by the byte.

The appending of the parity to the robust stream may use an encoder of a RSC type.

BRIEF DESCRIPTION OF THE DRAWINGS

These and/or other aspects and advantages of the invention will become apparent and more readily appreciated from the following description of the embodiments, taken in conjunction with the accompanying drawings of which:

FIGS. 4A and 4B are diagrams showing a format of a dual transport stream;

FIGS. 5A and 5B are diagrams showing another format of the dual transport stream;

DETAILED DESCRIPTION OF THE EMBODIMENTS

Figure 1:
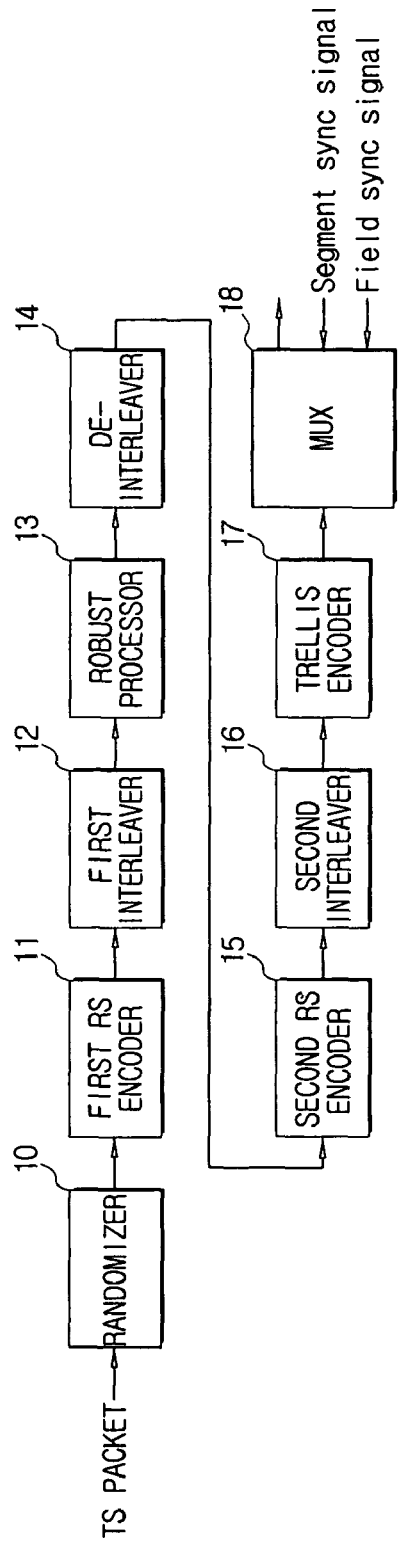
FIG. 1 is a block diagram of a conventional VSB transmission apparatus.

Reference will now be made in detail to the present embodiments of the present invention, examples of which are illustrated in the accompanying drawings, wherein like reference numerals refer to the like elements throughout. The embodiments are described below in order to explain the present invention by referring to the figures.

Figure 3:
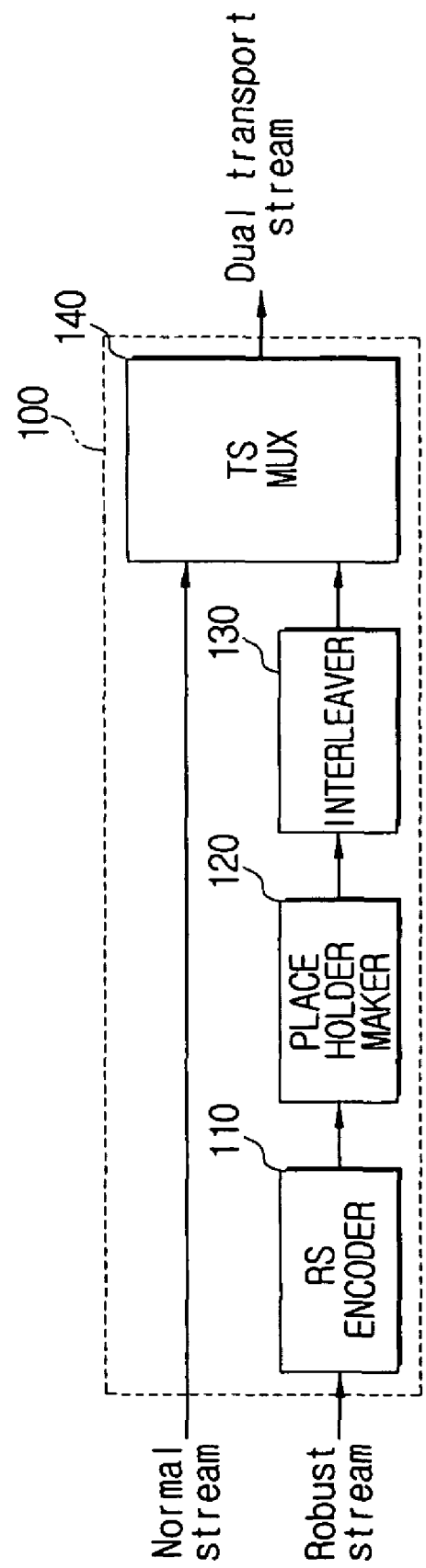
FIG. 3 is a block diagram of a TS constructor which is applied to the present invention.

FIG. 3 is a block diagram of a TS constructor.

A dual transport stream, which is applied to aspects of the present invention, is the combination of a normal stream and a robust stream. The dual transport stream can be generated at the TS constructor 100 of FIG. 3.

Referring now to FIG. 3, the TS constructor 100 includes a Reed-Solomon (RS) encoder 110, a place holder maker 120, an interleaver 130, and a TS MUX 140.

A normal stream and a robust stream are respectively input to the TS constructor 100. At this time, the normal stream is input directly to the TS MUX 140, whereas only the robust stream passes through the TS encoder 110, the place holder maker 120, and the interleaver 130 and then is fed to the TS MUX 140.

Parity is added to the robust stream at the RS encoder 110, and the place holder maker 120 generates an area to which parity is to be inserted by the robust encoder, which will be explained later. The robust stream is interleaved at the interleaver 130. Next, TS MUX 140 constructs a dual transport stream by multiplexing the normal stream and the robust stream. This method of generating a dual transport stream is well known to persons skilled in the art, and thus the detailed description of the TS constructor 100 will be omitted for brevity.

FIGS. 4A and 4B are diagrams showing formats of a dual transport stream.

Typically, a MPEG packet consists of a 1-byte sync, a 3-byte header, and a 184-byte payload. The header of the MPEG packet includes a packet identifier (PID). The type of data contained in the payload part determines whether the MPEG packet is the normal stream or the robust stream.

Stream (a) of FIG. 4A is an example of the robust stream inputted to the TS constructor 100. The payload part contains the robust data. The robust data is processed at the RS encoder 110, the placer holder maker 120, and the interleaver 130 of the TS constructor 100 and then fed to the TS MUX 140.

Stream (b) of FIG. 4A is an example of the normal stream inputted to the TS constructor 100. While the payload part contains the normal data, the stream (b) also includes an adaptation field into which the robust data is inserted by taking account of the combination with the robust stream. The adaptation field includes a 2-byte AF header and an N-byte null data space.

The robust stream (a) of FIG. 4A and the normal stream (b) of FIG. 4A are multiplexed at the TS MUX 140 to thus construct a dual transport stream as shown in stream (c) of FIG. 4A.

FIG. 4B shows another combination of the robust stream and the normal stream. A whole packet contains either the robust data or the normal data. The TS MUX 140 arranges the robust stream and the normal stream in the ratio of 1:3. Although the robust stream and the normal stream are shown as arranged in the ratio of 1:3 by way of example, the arrangement is not limited to this exemplary ratio.

FIGS. 5A and 5B are diagrams showing another format of the dual transport stream.

Stream (a) of FIG. 5A is a robust stream, and stream (b) of FIG. 5A is a normal stream including an S-byte stuff byte in the adaptation field. The S-byte stuff byte is an area to which a supplementary reference sequence (SRS) will be inserted by an SRS inserter, to be explained. The TS MUX 140 constructs a dual transport stream as shown in stream (c) by combining the robust stream (a) and the normal stream (b).

FIG. 5B shows a combination of the robust stream including the stuff byte and the normal stream in which a whole packet contains either the robust data or the normal data. The the robust stream and the normal stream are arranged in the ratio of 1:3 by way of example. It should be noted that the positions of the robust data and the stuff byte may be altered if necessary.

Figure 6:
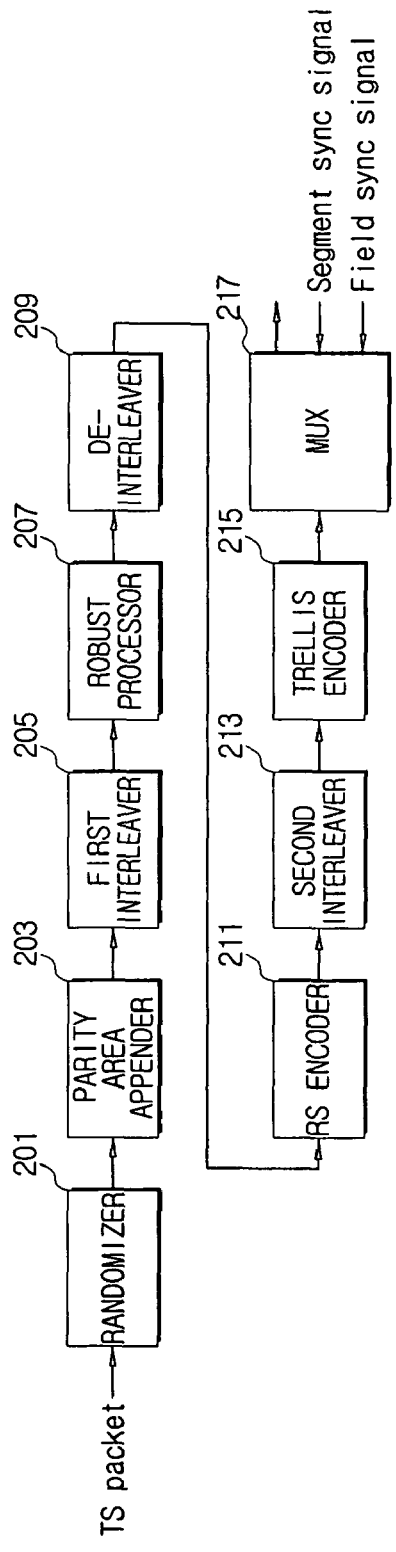
FIG. 6 is a block diagram of a digital broadcasting transmission apparatus which receives the dual transport stream of FIG. 4A or FIG. 4B.

FIG. 6 is a block diagram of a digital broadcasting transmission apparatus that receives the dual transport stream of FIG.4A or FIG. 4B. In this embodiment of the present invention, the digital broadcasting transmission apparatus includes a randomizer 201, a parity area appender 203, a first interleaver 205, a robust processor 207, a deinterleaver 209, an RS encoder 211, a second interleaver 213, a trellis encoder 215, and a MUX 217.

The randomizer 201 randomizes the dual transport stream input from the TS constructor 100. The dual transport stream fed to the randomizer 201 is formatted as in stream (c) of FIG. 4A or as in FIG. 4B. If an MPEG header is used, the dual transport stream may be 188 bytes. If an MPEG header is not used, the dual transport stream may be 187 bytes.

The parity area appender 203 adds an area so that the parity can be inserted into the randomized dual transport stream for error correction. The parity is inserted to this area at the RS encoder 211, to be explained.

The first interleaver 205 interleaves the dual transport stream having the appended area for inserting the parity. The interleaving serves to change data positions in a frame, rather than to change the data per se.

The robust processor 207 performs encoding in order to improve the performance of the robust stream included in the interleaved dual transport stream. The robust processor 207 will be further explained in reference to FIGS. 8 through 11.

The first deinterleaver 209 deinterleaves the dual transport stream processed at the robust processor 207.

The RS encoder 211 appends parity to the deinterleaved dual transport stream. In doing so, the RS encoder 211 inserts the parity into the area that was added to the dual transport stream by the parity area appender 203.

The second interleaver 213 interleaves the dual transport stream having the appended parity.

The trellis encoder 215 performs the trellis encoding to the interleaved dual transport stream.

The MUX 217 adds a segment sync signal and a field sync signal to the trellis-encoded dual transport stream and multiplexes it. Next, although it is not illustrated, the dual transport stream to which the segment sync signal and the field sync signal have been added passes through channel modulation and conversion to a signal of an RF channel band, and then is transmitted.

Figure 7:
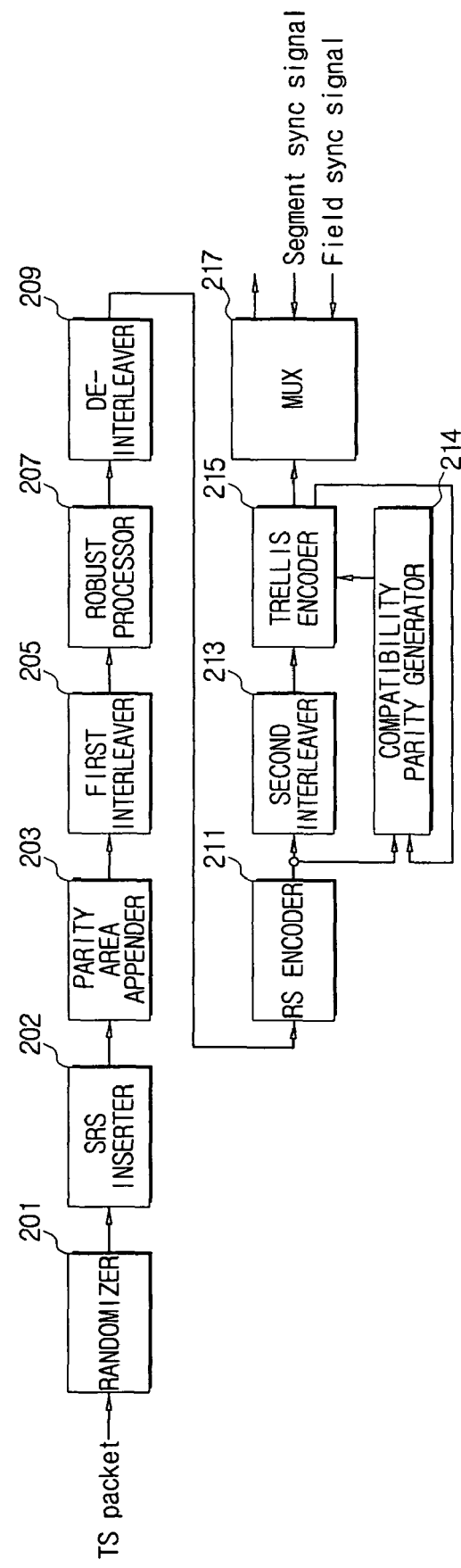
FIG. 7 is a block diagram of a digital broadcasting transmission apparatus which receives the dual transport stream of FIG. 5A or FIG. 5B.

FIG. 7 illustrates a digital broadcasting transmission apparatus according to another embodiment of the present invention. In particular, FIG. 7 is a block diagram of a digital broadcasting transmission apparatus that receives the dual transport stream of FIG. 5A or FIG. 5B.

According to FIG. 7, the digital broadcasting transmission apparatus includes a randomizer 201, an SRS inserter 202, a parity area appender 203, a first interleaver 205, a robust processor 207, a deinterleaver 209, an RS encoder 211, a second interleaver 213, a compatibility parity generator 214, a trellis encoder 215, and a MUX 217.

The digital broadcasting transmission apparatus of this embodiment has a structure similar to the digital broadcasting transmission apparatus of FIG. 6. Therefore, identical reference numerals are used with respect to the like elements.

The randomizer 201 receives the dual transport stream which includes the stuff byte in the adaptation field as shown in stream (c) of FIG. 5A or as shown in FIG. 5B.

The SRS inserter 202 inserts an SRS into the stuff byte included in the dual transport stream which has been randomized at the randomizer 201. In doing so, the loss and mixing ratio of the payload due to the SRS can be determined according to the rate of insertion of the AF header and the stuff byte into the dual transport stream.

The compatibility parity generator 214 generates a compatibility parity based on a packet of the dual transport stream to which the parity is appended by the RS encoder 211 and based on the dual transport stream that is trellis-encoded by the trellis encoder 215. The compatibility parity generator 214 provides the generated compatibility parity to the trellis encoder 215.

The trellis encoder 215 trellis-encodes the dual transport stream that has been interleaved by the second interleaver 213 and provides the trellis-encoded dual transport stream to the compatibility parity generator 214. Afterwards, when the compatibility parity is fed from the compatibility parity generator 214, the trellis encoder 215 appends the compatibility parity to the interleaved dual transport stream and provides it to the MUX 217.

The MUX 217 adds a segment sync signal and a field sync signal to the dual transport stream to which the compatibility parity has been appended by the trellis encoder 215, multiplexes and outputs the resultant stream.

Figure 8A:
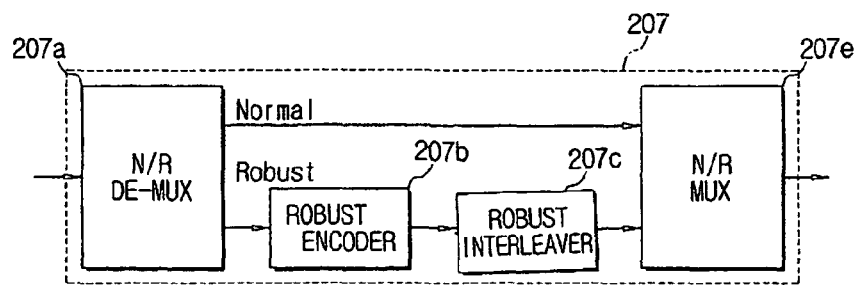
FIG. 8A is a block diagram of a robust processor according to one embodiment of the present invention.

FIG. 8A is a block diagram of a robust processor according to one embodiment of the present invention.

As shown in FIG. 8A, the robust processor 207 according to an embodiment of the present invention includes an N/R DE-MUX 207*a*, a robust encoder 207*b*, a robust interleaver 207*c*, and an N/R MUX 207*e*.

The N/R DE-MUX 207*a* demultiplexes the dual transport stream that has been interleaved by the first interleaver 205 and thus separates the normal stream and the robust stream. Next, the N/R DE-MUX 207*a* converts the bytewise robust stream into two bits starting from a most significant bit (MSB) to a least significant bit (LSB) in order, and provides the converted two bits to the robust interleaver 207*c*.

For instance, when 1-byte input, that is, an 8-bit input is numbered from the MSB to the LSB in order, such as 7, 6, 5, 4, 3, 2, 1, 0, the 8-bit input is converted to 4 symbols in the order of (7, 6), (5, 4), (3, 2), and (1, 0).

Next, the N/R DE-MUX 207*a* provides the normal stream, which is separated through the demultiplexing, to the N/R MUX 207*e*, and provides the robust stream, which is converted to the symbols, to the robust encoder 207*b*.

The robust encoder 207*b* convolutionally encodes the robust stream fed from the N/R DE-MUX 207*a*. Herein, convolution encoding refers to parity appending with respect to the robust stream.

According to this embodiment of the present invention, an encoder of a Recursive Systematic Code (RSC) type can be used as the robust encoder 207*b* and will be described in further detail in reference to FIG. 9.

The robust interleaver 207c interleaves the convolutionally encoded robust stream.

The N/R MUX 207e outputs a dual transport stream by multiplexing the normal stream fed from the N/R DE-MUX 207a and the robust stream fed from the symbol deinterleaver 207d.

Figure 8B:
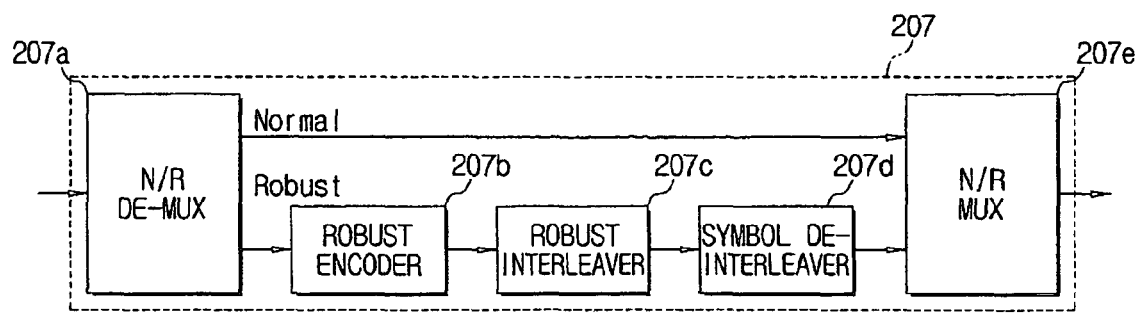
FIG. 8B is a block diagram of a robust processor according to another embodiment of the present invention.

FIG. 8B is a block diagram of a robust processor according to another embodiment of the present invention. Since the robust processor 207 of FIG. 8B has a similar structure to the robust processors 207 of FIG. 8A and shares the same elements, but with differences as further described herein, the same reference numeral 207 is used herein to identify both the robust processors 207 of FIGS. 8A and the robust processor 207 of FIG. 8B. As shown in FIG. 8B, the robust processor 207 includes the same elements as the robust processor 207 of FIG. 8A, in particular, an N/R DE-MUX 207a, a robust encoder 207b, a robust interleaver 207c, and an N/R MUX 207e. The robust processor 207 of FIG. 8B further includes a symbol deinterleaver 207d. The symbol deinterleaver 207d deinterleaves the interleaved robust stream. The symbol deinterleaver will be described in more detail in reference to FIG. 10.

Figure 9:
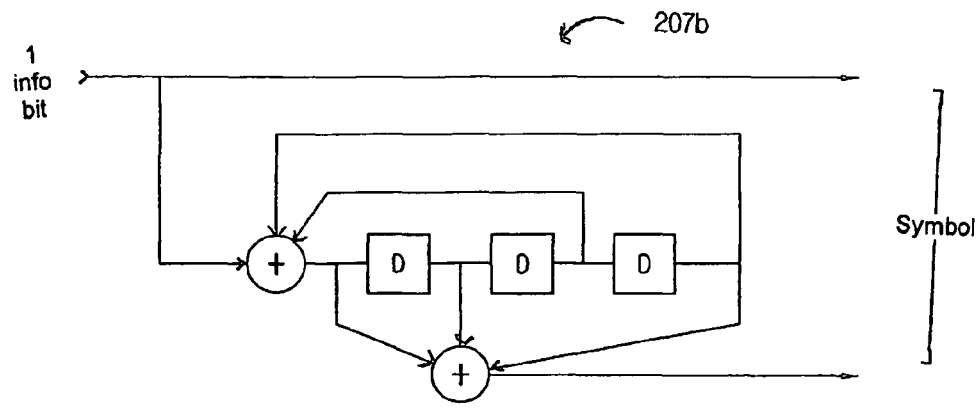
FIG. 9 is a diagram showing a robust encoder of FIG. 8.
Figure 11:
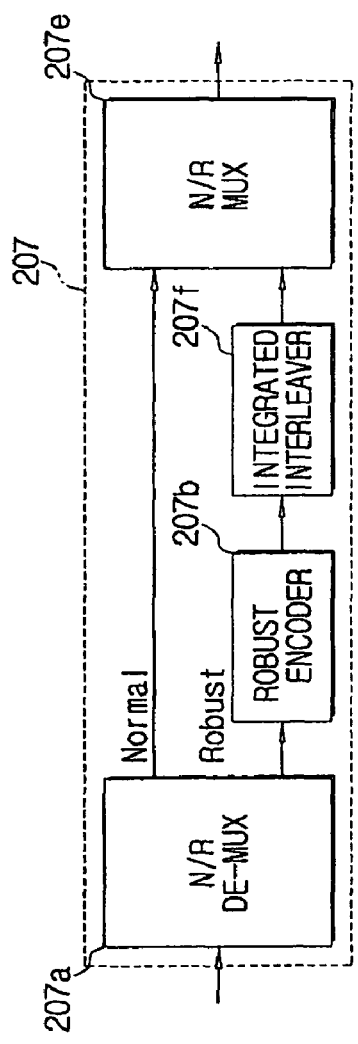
FIG. 11 is a block diagram of a robust processor according to another embodiment of the pre

FIG. 9 is a diagram showing the robust encoder 207b of FIGS. 8A, 8B and 11.

The robust encoder 207b operates in association with the place holder maker 120, which has been illustrated in reference to FIG. 3. For instance, if the place holder maker 120 generates the input data of 7, 6, 5, 4, 3, 2, 1, 0 starting from the MSB to the LSB to the 2-byte data in order of (7, x, 6, x, 5, x, 4, x) and (3, x, 2, x, 1, x, 0, x) for the ½rate coding, the robust encoder 207b receives and codes only the data of 7, 5, 3, 1 of the 2 bits forming one symbol when the input data is converted to 4 symbols in order of (7, 6), (5, 4), (3, 2), (1, 0).

The generated output of 2 bits may be replaced even in a part having no information. When the encoder of the RSC type as shown in FIG. 9 is used for the robust encoder 207b, parities are simply replaced in the part having no information since there is no change to the input and the output.

In an embodiment wherein the robust encoder 207b performs the coding of ¼ rate, the place holder maker 120 fills only one bit of 4 successive bits with data having information, and inserts an arbitrary value in the remaining three bits. At this time, of 2 symbols consecutively fed to the robust encoder 207b, only one bit has information. As mentioned earlier, the robust encoder 207b operates with respect to only one bit of the data input, and creates the output of 4 bits to replace a 4-bit part having information or having no information.

For instance, when the place holder maker 120 outputs (a, x, y, z) with respect to an input 1-bit "a" (x, y, z are arbitrary values having no information), two symbols of (a, x), (y, z) being input in sequence are generated by a byte-to-symbol conversion, which is well-known. Only the data part "a" of the input is received in accordance with the operation of the place holder maker 120 so as to output 4 bits. The output 4 bits are replaced with the input 2 symbols of (a, x) and (y, z).

In the embodiment wherein an RSC type encoder as shown in FIG. 9 (the encoder of ½ rate) is used for the robust encoder 207b, the output resulting from the ¼ rate may be duplicated.

When two symbols of (a, x), (y, z) are received as the input, only "a" is used as the input and (p1, p2) is outputted. When the output (p1, p2) is generated, (a, p), (a, p) may be outputted.

Of the successive 4-bit output generated for the coding of ¼ rate at the place holder maker 120, the position of the input data may be arbitrary. The robust encoder 207b can employ only the agreed data as the input using the data position agreed with the place holder maker 120, and replace all of the 4-bit input by making an output.

As illustrated above, when the place holder maker 120 operates, two successive symbols, which are generated from 1-bit input data using the byte-to-symbol conversion, which groups two bits starting from the MSB to the LSB, are fed to the robust encoder 207.

Figure 2:
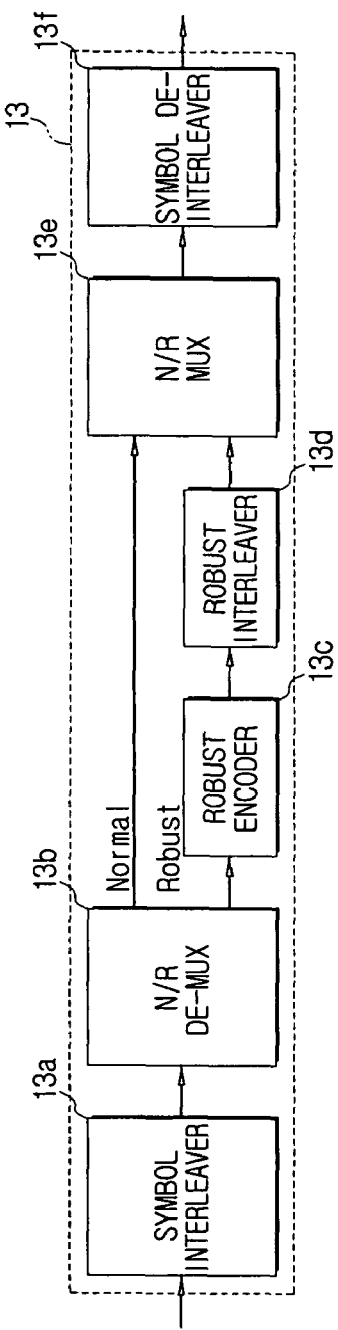
FIG. 2 is a block diagram of a robust processor of FIG. 1.

In other words, if the conventional robust processor 13 includes the symbol deinterleaver 13f in FIG. 2, since the two-symbol positions generated from the 1-bit input are mixed, the conventional digital broadcasting reception apparatus needs to match the two-symbol position at the design phase.

However, in the embodiment of the present invention, as the outputted two symbols generated from the data input appear in succession, the positions of the two symbols can be acquired at any time. Thus, the design of the digital broadcasting receiving apparatus can be simplified.

Figure 10:
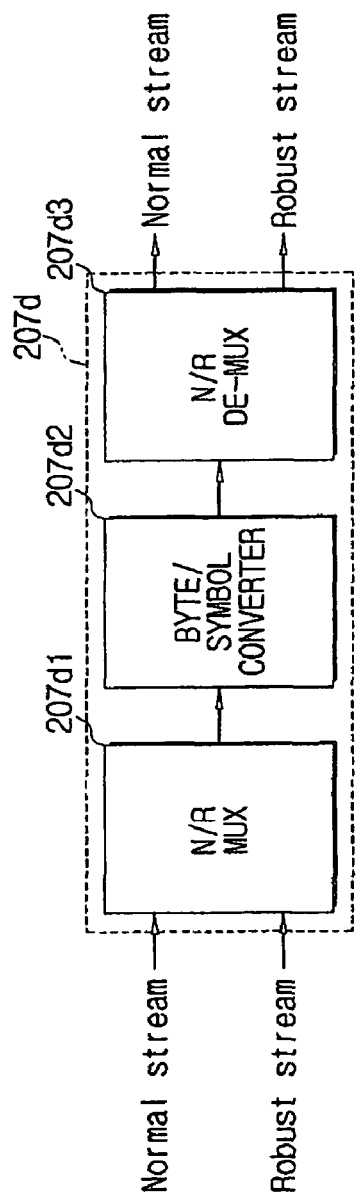
FIG. 10 is a block diagram of a symbol deinterleaver of FIG. 8.

FIG. 10 is a block diagram of the symbol deinterleaver 207d of FIG. 8.

The symbol deinterleaver 207d serves to deinterleave the interleaved robust stream. The symbol deinterleaver 207d includes an N/R MUX 207d1, a byte/symbol converter 207d2, and an N/R DE-MUX 207d3.

The output of the robust encoder 207b passes through the robust interleaver 207c, which is used to improve the performance in the information exchange at a robust decoder of a digital broadcasting receiving apparatus, to be explained, and the symbol deinterleaver 207d. Next, the output is inserted into the original position of the robust stream by combining with the normal stream at the N/R MUX 207e and then is outputted.

The symbol deinterleaver 207d is used to fulfill the simple information exchange by virtue of the N/R MUX 207d1, the byte/symbol converter 207d2, and the N/R DE-MUX 207d3, without having to passing through the conventional byte-to-symbol conversion at the digital broadcasting receiving apparatus.

The N/R MUX 207d1 multiplexes and combines the normal stream and the robust stream fed to the symbol deinterleaver 207d.

The byte/symbol converter 207d2 converts the normal stream and the robust stream that are multiplexed at the N/R MUX 207d1, by the byte.

The N/R DE-MUX 207d3 demultiplexes and separates the normal stream and the robust stream that were converted by the byte at the byte/symbol converter 207d2, and then outputs the separated streams.

The symbol deinterleaver 13f of the conventional robust processor 13 of FIG. 2 operates with respect to all data of the normal stream and the robust stream, whereas the symbol deinterleaver 207d according to this embodiment of the present invention operates with respect to only the robust stream. In addition, the symbol deinterleaver 207d can be set to have a different value according to the robust stream position of the input data.

As the symbol deinterleaver 207d is affected by the deinterleaver 209 and the byte-to-symbol conversion, its size is equal to the symbol size transmitted to the robust stream for 52 segments. For instance, the number of robust stream space appearing in 52 segments is 52/4+13. Herein, by taking account of the conversion of 1 byte to 4 symbols, the symbol deinterleaver 207d can serve as a 128* 4* 13=6656 block interleaver.

FIG. 11 is a block diagram of the robust processor 207 according to another embodiment of the present invention. Since the robust processor 207 of FIG. 11 has a similar structure to the robust processors 207 of FIGS. 8A and 8B and shares the same elements, but with differences as further described herein, the same reference numeral 207 is used herein to identify both the robust processors 207 of FIGS. 8A and 8B and the robust processor 207 of FIG. 11.

While the robust processor 207 as shown in FIG. 8B includes the symbol deinterleaver 207d and the robust interleaver 207c separately, in the robust processor 207 according to the embodiment shown in FIG. 11, the symbol deinterleaver 207d and the robust interleaver 207d are implemented as a single interleaver 207f.

In other words, the symbol deinterleaver 207d and the robust interleaver 207c operate in the same unit size. Thus, as shown in FIG. 11, the symbol deinterleaver 207d and the robust interleaver 207c can be implemented as one interleaver which is an integrated interleaver 207f.

Figure 12:
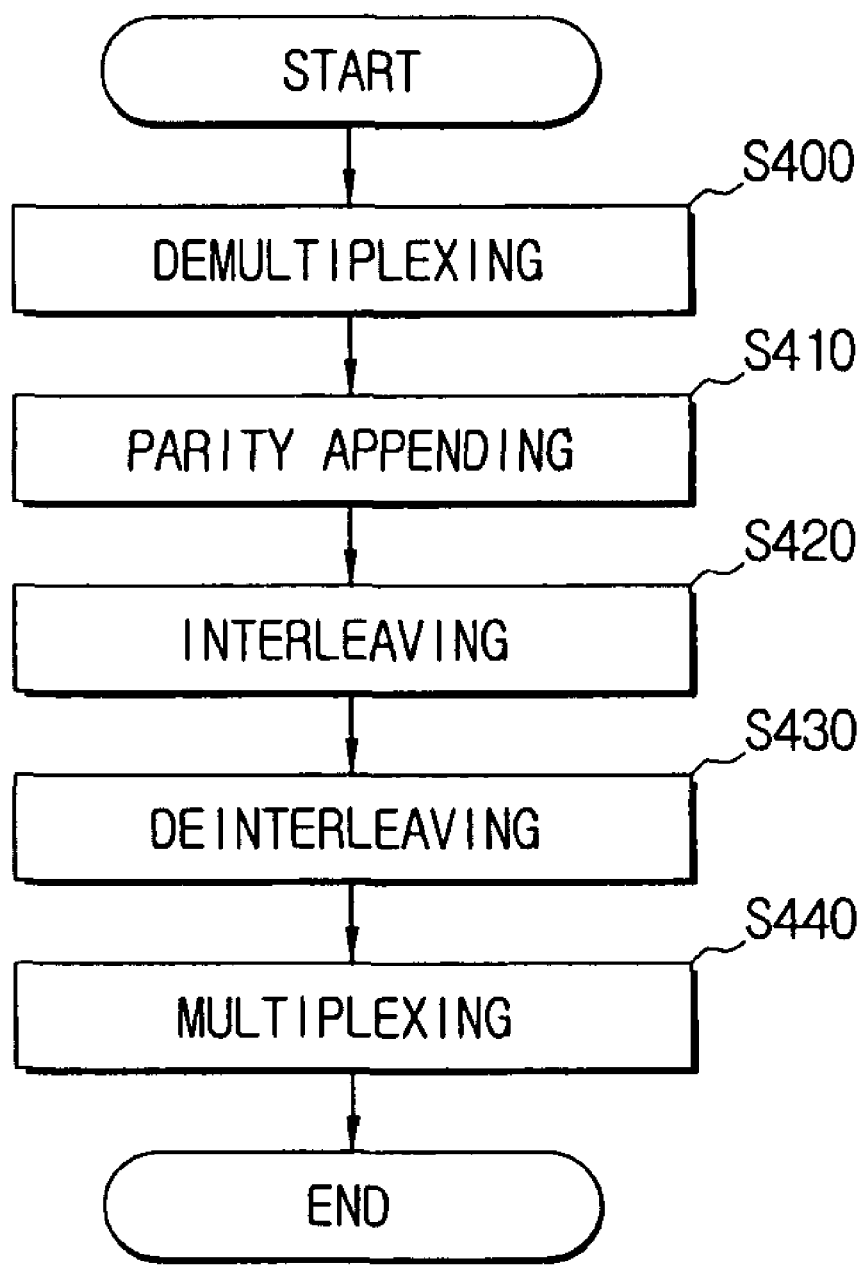
FIG. 12 is a flowchart outlining a robust stream coding method according to an embodiment of the present invention.

FIG. 12 is a flowchart outlining a robust stream coding method according to an embodiment of the present invention.

Hereafter, the robust stream coding method is illustrated in reference to FIGS. 3 through 11. Specifically, the robust stream coding method at the robust processor 207 as shown in FIG. 8 is now illustrated. However, the robust stream coding method at the robust processor 207 as shown in FIG. 11 is similar, except for combining operations S420 and S430.

As explained earlier, prior to the input to the robust processor 207, the dual transport stream goes through randomization, parity area generation, and interleaving. The robust stream included in the dual transport stream is coded at the robust processor 207.

When the dual transport stream is input to the robust processor 207, the N/R DE-MUX 207a separates the normal stream and the robust stream by demultiplexing the dual transport stream. At operation S400, the N/R DE-MUX 207a converts the separated robust stream by the symbol, provides the normal stream directly to the N/R MUX 207e, and provides only the robust stream to the robust encoder 207b.

At operation S410, the robust encoder 207b appends the parity to the robust stream fed from the N/R DE-MUX 207a. At operation S420, the robust interleaver 207c interleaves the parity-appended robust stream.

At operation S430, the symbol deinterleaver 207d deinterleaves the interleaved symbol-wise robust stream. In doing so, the symbol deinterleaver 207d converts and outputs the robust stream by the byte.

After passing through the robust encoder 207b, the robust interleaver 207c, and the symbol deinterleaver 207d, the robust stream separated at the N/R DE-MUX 207a is fed to the N/R MUX 207e. At operation S440, the N/R MUX 207e multiplexes the normal stream fed from the N/R DE-MUX 207a and the robust stream fed from the symbol deinterleaver 207d.

Next, the dual transport stream multiplexed at the N/R MUX 207e is transmitted after passing through deinterleaving, RS encoding, interleaving, trellis encoding, multiplexing, as shown in FIGS. 6 and 7, and undergoing modulation.

As set forth, according to an embodiment of the present invention, the digital broadcasting transmission apparatus and the robust stream coding method thereof do not complicate the structure of the receiver even when the additional coding is implemented at various rates to improve the performance of the robust stream included in the dual transport stream. In addition, advantageously, the compatibility with the existing transmission and reception apparatuses are enabled.

Although a few embodiments of the present invention have been shown and described, it would be appreciated by those skilled in the art that changes may be made in these embodiments without departing from the principles and spirit of the invention, the scope of which is defined in the claims and their equivalents.

What is claimed is:

1. A digital broadcasting transmission apparatus comprising:
   a robust processor that codes a robust stream of a dual transport stream in which a normal stream and the robust stream are combined,
   wherein the robust processor comprises:
      a demultiplexer (DE-MUX) that separates the normal stream and the robust stream from the dual transport stream;
      a robust encoder that appends a parity to the separated robust stream;
      a robust interleaver that interleaves the robust stream having the appended parity;
      a symbol deinterleaver that converts the robust stream from symbols to bytes; and
      a multiplexer (MUX) that combines the interleaved, converted robust stream and the separated normal stream.

2. The digital broadcasting transmission apparatus of claim 1, wherein the DE-MUX converts and outputs the separated robust stream by the symbol.

3. The digital broadcasting transmission apparatus of claim 2, wherein the symbol deinterleaver deinterleaves the robust stream after the robust stream is interleaved by the symbol.

4. The digital broadcasting transmission apparatus of claim 3, wherein the symbol deinterleaver comprises:
   a (normal/robust) N/R MUX that combines the normal stream and the robust stream;
   a byte/symbol converter that converts the combined normal stream and robust stream by the byte; and
   an N/R DE-MUX that separates the normal stream and the robust stream after the normal stream and the robust stream are converted by the byte.

5. The digital broadcasting transmission apparatus of claim 1, wherein the robust encoder is a Recursive Systematic Convolutional (RSC) encoder.

6. A digital broadcasting transmission apparatus comprising:
   a randomizer, a parity area appender, a first interleaver, a robust processor, a deinterleaver, a Reed-Solomon (RS) encoder, a second interleaver, a trellis encoder, and a MUX,
   wherein the robust processor codes a robust stream of a dual transport stream in which a normal stream and the robust stream are combined and comprises:
      a demultiplexer (DE-MUX) that separates the normal stream and the robust stream from the dual transport stream;
      a robust encoder that appends a parity to the separated robust stream;
      a robust interleaver that interleaves the robust stream having the appended parity;
      a symbol deinterleaver that converts the robust stream from symbols to bytes; and
      a multiplexer (MUX) that combines the interleaved, converted robust stream and the separated normal stream.

7. A digital broadcasting transmission apparatus comprising:
   a randomizer, supplementary reference sequence (SRS) inserter, a parity area appender, a first interleaver, a robust processor, a deinterleaver, a Reed-Solomon (RS)

encoder, a second interleaver, a compatibility parity generator, a trellis encoder, and a MUX, wherein the robust processor codes a robust stream of a dual transport stream in which a normal stream and the robust stream are combined and comprises:

a demultiplexer (DE-MUX) that separates the normal stream and the robust stream from the dual transport stream;

a robust encoder that appends a parity to the separated robust stream;

a robust interleaver that interleaves the robust stream having the appended parity;

a symbol deinterleaver that converts the robust stream from symbols to bytes; and a multiplexer (MUX) that combines the interleaved, converted robust stream and the separated normal stream.

8. A robust stream coding method of a dual transport stream where a normal stream and a robust stream are combined at a digital broadcasting transmission apparatus, the method comprising:

separating the normal stream and the robust stream from the dual transport stream;

appending a parity to the separated robust stream;

interleaving the robust stream having the appended parity;

converting the robust stream from symbols to bytes; and combining the interleaved, converted robust stream and the separated normal stream.

9. The robust stream coding method of claim 8, wherein the separating of the normal stream and the robust stream converts and outputs the separated robust stream by the symbol.

10. The robust stream coding method of claim 9, further comprising:

deinterleaving the robust stream.

11. The robust stream coding method of claim 8, wherein the deinterleaving of the robust stream comprises:

combining the normal stream and the robust stream;

converting the combined normal stream and robust stream by the byte; and separating the normal stream and the robust stream.

12. The robust stream coding method of claim 8, wherein the appending of the parity to the robust stream uses a Recursive Systematic Convolutional (RSC) encoder.

* * * * *